United States Patent
Leipold et al.

(10) Patent No.: US 10,090,339 B2
(45) Date of Patent: Oct. 2, 2018

(54) RADIO FREQUENCY (RF) SWITCH

(71) Applicant: Qorvo US, Inc., Greensboro, NC (US)

(72) Inventors: Dirk Robert Walter Leipold, San Jose, CA (US); George Maxim, Saratoga, CA (US); Baker Scott, San Jose, CA (US); Julio C. Costa, Oak Ridge, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/789,107

(22) Filed: Oct. 20, 2017

(65) Prior Publication Data

US 2018/0114801 A1    Apr. 26, 2018

Related U.S. Application Data

(60) Provisional application No. 62/410,965, filed on Oct. 21, 2016.

(51) Int. Cl.
*H01L 27/13* (2006.01)
*H01L 23/528* (2006.01)
(Continued)

(52) U.S. Cl.
CPC .......... *H01L 27/13* (2013.01); *H01L 23/528* (2013.01); *H01L 23/5226* (2013.01);
(Continued)

(58) Field of Classification Search
CPC .......... H01L 23/528–23/5286; H01L 27/0207; H01L 27/105; H01L 27/1255; H01L 27/13
See application file for complete search history.

(56) References Cited

U.S. PATENT DOCUMENTS 4,093,562 A   6/1978  Kishimoto
4,366,202 A  12/1982  Borovsky
(Continued)

FOREIGN PATENT DOCUMENTS

CN   103811474 A    5/2014
EP     2996143 A1   3/2016
(Continued)

OTHER PUBLICATIONS

Raskin, Jean-Pierre et al., "Substrate Crosstalk Reduction Using SOI Technology," IEEE Transactions on Electron Devices, vol. 44, No. 12, Dec. 1997, pp. 2252-2261.
(Continued)

*Primary Examiner* — Daniel Shook
(74) *Attorney, Agent, or Firm* — Withrow & Terranova, P.L.L.C.

(57) ABSTRACT

Disclosed is a radio frequency (RF) switch that includes a substrate and a plurality of elongated drain/source (D/S) diffusion regions laterally disposed in parallel with one another and separated by a plurality of elongated channel regions. A plurality of elongated D/S resistor regions extends between an adjacent pair of plurality of elongated D/S diffusion regions, and a plurality of elongated gate structures resides over corresponding ones of the elongated channel regions. A silicide layer resides over a majority of at least top surfaces of the plurality of the elongated D/S diffusion regions and the plurality of elongated gate structures, wherein less than a majority of each of the plurality of the elongated D/S resistor regions are covered by the silicide layer.

23 Claims, 6 Drawing Sheets

(51) Int. Cl.
*H01L 23/522* (2006.01)
*H01L 29/45* (2006.01)
*H01L 29/08* (2006.01)
*H01L 27/12* (2006.01)
*H01L 49/02* (2006.01)

(52) U.S. Cl.
CPC ...... *H01L 27/1255* (2013.01); *H01L 29/0847* (2013.01); *H01L 29/458* (2013.01); *H01L 28/20* (2013.01)

(56) References Cited

U.S. PATENT DOCUMENTS

| | | | |
|---|---|---|---|
| 5,061,663 A | 10/1991 | Bolt et al. | |
| 5,069,626 A | 12/1991 | Patterson et al. | |
| 5,391,257 A | 2/1995 | Sullivan et al. | |
| 5,459,368 A | 10/1995 | Onishi et al. | |
| 5,646,432 A | 7/1997 | Iwaki et al. | |
| 5,648,013 A | 7/1997 | Uchida et al. | |
| 5,699,027 A | 12/1997 | Tsuji et al. | |
| 5,709,960 A | 1/1998 | Mays et al. | |
| 5,831,369 A | 11/1998 | Fürbacher et al. | |
| 5,920,142 A | 7/1999 | Onishi et al. | |
| 6,072,557 A | 6/2000 | Kishimoto | |
| 6,084,284 A | 7/2000 | Adamic, Jr. | |
| 6,154,366 A | 11/2000 | Ma et al. | |
| 6,154,372 A | 11/2000 | Kalivas et al. | |
| 6,235,554 B1 | 5/2001 | Akram et al. | |
| 6,236,061 B1 | 5/2001 | Walpita | |
| 6,268,654 B1 | 7/2001 | Glenn et al. | |
| 6,271,469 B1 | 8/2001 | Ma et al. | |
| 6,423,570 B1 | 7/2002 | Ma et al. | |
| 6,426,559 B1 | 7/2002 | Bryan et al. | |
| 6,446,316 B1 | 9/2002 | Fürbacher et al. | |
| 6,578,458 B1 | 6/2003 | Akram et al. | |
| 6,649,012 B2 | 11/2003 | Masayuki et al. | |
| 6,713,859 B1 | 3/2004 | Ma | |
| 6,841,413 B2 | 1/2005 | Liu et al. | |
| 6,864,156 B1 | 3/2005 | Conn | |
| 6,902,950 B2 | 6/2005 | Ma et al. | |
| 6,943,429 B1 | 9/2005 | Glenn et al. | |
| 6,964,889 B2 | 11/2005 | Ma et al. | |
| 6,992,400 B2 | 1/2006 | Tikka et al. | |
| 7,042,072 B1 | 5/2006 | Kim et al. | |
| 7,049,692 B2 | 5/2006 | Nishimura et al. | |
| 7,109,635 B1 | 9/2006 | McClure et al. | |
| 7,183,172 B2 | 2/2007 | Lee et al. | |
| 7,288,435 B2 | 10/2007 | Aigner et al. | |
| 7,307,003 B2 | 12/2007 | Reif et al. | |
| 7,393,770 B2 | 7/2008 | Wood et al. | |
| 7,427,824 B2 | 9/2008 | Iwamoto et al. | |
| 7,596,849 B1 | 10/2009 | Carpenter et al. | |
| 7,619,347 B1 | 11/2009 | Bhattacharjee | |
| 7,635,636 B2 | 12/2009 | McClure et al. | |
| 7,714,535 B2 | 5/2010 | Yamazaki et al. | |
| 7,749,882 B2 | 7/2010 | Kweon et al. | |
| 7,790,543 B2 | 9/2010 | Abadeer et al. | |
| 7,855,101 B2 | 12/2010 | Furman et al. | |
| 7,868,419 B1 | 1/2011 | Kerr et al. | |
| 7,960,218 B2 | 6/2011 | Ma et al. | |
| 8,183,151 B2 | 5/2012 | Lake | |
| 8,420,447 B2 | 4/2013 | Tay et al. | |
| 8,503,186 B2 | 8/2013 | Lin et al. | |
| 8,643,148 B2 | 2/2014 | Lin et al. | |
| 8,658,475 B1 | 2/2014 | Kerr | |
| 8,664,044 B2 | 3/2014 | Jin et al. | |
| 8,772,853 B2 | 7/2014 | Hong et al. | |
| 8,791,532 B2 | 7/2014 | Graf et al. | |
| 8,802,495 B2 | 8/2014 | Kim et al. | |
| 8,816,407 B2 | 8/2014 | Kim et al. | |
| 8,835,978 B2 | 9/2014 | Mauder et al. | |
| 8,906,755 B1 | 12/2014 | Hekmatshoartabari et al. | |
| 8,921,990 B2 | 12/2014 | Park et al. | |
| 8,927,968 B2 | 1/2015 | Cohen et al. | |
| 8,941,248 B2 | 1/2015 | Lin et al. | |
| 8,963,321 B2 | 2/2015 | Lenniger et al. | |
| 9,165,793 B1 | 10/2015 | Wang et al. | |
| 9,214,337 B2 | 12/2015 | Carroll et al. | |
| 9,368,429 B2 | 6/2016 | Ma et al. | |
| 9,461,001 B1 | 10/2016 | Tsai et al. | |
| 9,530,709 B2 | 12/2016 | Leipold et al. | |
| 9,613,831 B2 | 4/2017 | Morris et al. | |
| 9,646,856 B2 | 5/2017 | Meyer et al. | |
| 9,859,254 B1 | 1/2018 | Yu et al. | |
| 9,941,245 B2 | 4/2018 | Skeete et al. | |
| 2001/0004131 A1 | 6/2001 | Masayuki et al. | |
| 2002/0070443 A1 | 6/2002 | Mu et al. | |
| 2002/0074641 A1 | 6/2002 | Towle et al. | |
| 2002/0127769 A1 | 9/2002 | Ma et al. | |
| 2002/0127780 A1 | 9/2002 | Ma et al. | |
| 2002/0137263 A1 | 9/2002 | Towle et al. | |
| 2002/0185675 A1 | 12/2002 | Furukawa | |
| 2003/0207515 A1 | 11/2003 | Tan et al. | |
| 2004/0164367 A1 | 8/2004 | Park | |
| 2004/0166642 A1 | 8/2004 | Chen et al. | |
| 2004/0219765 A1 | 11/2004 | Reif et al. | |
| 2005/0037595 A1 | 2/2005 | Nakahata | |
| 2005/0079686 A1 | 4/2005 | Aigner et al. | |
| 2005/0212419 A1 | 9/2005 | Vazan et al. | |
| 2006/0057782 A1 | 3/2006 | Gardes et al. | |
| 2006/0105496 A1 | 5/2006 | Chen et al. | |
| 2006/0108585 A1 | 5/2006 | Gan et al. | |
| 2006/0261446 A1 | 11/2006 | Wood et al. | |
| 2007/0020807 A1 | 1/2007 | Geefay et al. | |
| 2007/0069393 A1 | 3/2007 | Asahi et al. | |
| 2007/0075317 A1 | 4/2007 | Kato et al. | |
| 2007/0121326 A1 | 5/2007 | Nall et al. | |
| 2007/0158746 A1* | 7/2007 | Ohguro .............. H01L 21/84 257/350 |
| 2007/0181992 A1 | 8/2007 | Lake | |
| 2007/0190747 A1 | 8/2007 | Humpston et al. | |
| 2007/0252481 A1 | 11/2007 | Iwamoto et al. | |
| 2007/0276092 A1 | 11/2007 | Kanae et al. | |
| 2008/0050852 A1 | 2/2008 | Hwang et al. | |
| 2008/0050901 A1 | 2/2008 | Kweon et al. | |
| 2008/0164528 A1 | 7/2008 | Cohen et al. | |
| 2008/0272497 A1 | 11/2008 | Lake | |
| 2008/0315372 A1 | 12/2008 | Kuan et al. | |
| 2009/0008714 A1 | 1/2009 | Chae | |
| 2009/0010056 A1 | 1/2009 | Kuo et al. | |
| 2009/0014856 A1 | 1/2009 | Knickerbocker | |
| 2009/0179266 A1 | 7/2009 | Abadeer et al. | |
| 2009/0261460 A1 | 10/2009 | Kuan et al. | |
| 2010/0012354 A1 | 1/2010 | Hedin et al. | |
| 2010/0029045 A1 | 2/2010 | Ramanathan et al. | |
| 2010/0045145 A1 | 2/2010 | Tsuda | |
| 2010/0081232 A1 | 4/2010 | Furman et al. | |
| 2010/0081237 A1 | 4/2010 | Wong et al. | |
| 2010/0109122 A1 | 5/2010 | Ding et al. | |
| 2010/0127340 A1 | 5/2010 | Sugizaki | |
| 2010/0173436 A1 | 7/2010 | Ouellet et al. | |
| 2010/0200919 A1 | 8/2010 | Kikuchi | |
| 2011/0003433 A1 | 1/2011 | Harayama et al. | |
| 2011/0026232 A1 | 2/2011 | Lin et al. | |
| 2011/0036400 A1 | 2/2011 | Murphy et al. | |
| 2011/0062549 A1 | 3/2011 | Lin | |
| 2011/0068433 A1 | 3/2011 | Kim et al. | |
| 2011/0102002 A1 | 5/2011 | Riehl et al. | |
| 2011/0171792 A1 | 7/2011 | Chang et al. | |
| 2011/0272800 A1 | 11/2011 | Chino | |
| 2011/0272824 A1 | 11/2011 | Pagaila | |
| 2011/0294244 A1 | 12/2011 | Hattori et al. | |
| 2012/0003813 A1 | 1/2012 | Chuang et al. | |
| 2012/0068276 A1 | 3/2012 | Lin et al. | |
| 2012/0094418 A1 | 4/2012 | Grama et al. | |
| 2012/0098074 A1 | 4/2012 | Lin et al. | |
| 2012/0104495 A1 | 5/2012 | Zhu et al. | |
| 2012/0119346 A1 | 5/2012 | Im et al. | |
| 2012/0153393 A1 | 6/2012 | Liang et al. | |
| 2012/0168863 A1 | 7/2012 | Zhu et al. | |
| 2012/0256260 A1 | 10/2012 | Cheng et al. | |
| 2012/0292700 A1 | 11/2012 | Khakifirooz et al. | |
| 2012/0299105 A1 | 11/2012 | Cai et al. | |
| 2013/0001665 A1 | 1/2013 | Zhu et al. | |

(56) References Cited

U.S. PATENT DOCUMENTS

| | | |
|---|---|---|
| 2013/0015429 A1 | 1/2013 | Hong et al. |
| 2013/0049205 A1 | 2/2013 | Meyer et al. |
| 2013/0099315 A1 | 4/2013 | Zhu et al. |
| 2013/0105966 A1 | 5/2013 | Kelkar et al. |
| 2013/0147009 A1 | 6/2013 | Kim |
| 2013/0155681 A1 | 6/2013 | Nall et al. |
| 2013/0196483 A1 | 8/2013 | Dennard et al. |
| 2013/0200456 A1 | 8/2013 | Zhu et al. |
| 2013/0280826 A1 | 10/2013 | Scanlan et al. |
| 2013/0299871 A1 | 11/2013 | Mauder et al. |
| 2014/0035129 A1 | 2/2014 | Stuber et al. |
| 2014/0134803 A1 | 5/2014 | Kelly et al. |
| 2014/0168014 A1 | 6/2014 | Chih et al. |
| 2014/0197530 A1 | 7/2014 | Meyer et al. |
| 2014/0210314 A1 | 7/2014 | Bhattacharjee et al. |
| 2014/0252566 A1 | 9/2014 | Kerr et al. |
| 2014/0252567 A1 | 9/2014 | Carroll et al. |
| 2014/0264813 A1 | 9/2014 | Lin et al. |
| 2014/0264818 A1 | 9/2014 | Lowe, Jr. et al. |
| 2014/0306324 A1 | 10/2014 | Costa et al. |
| 2014/0327003 A1 | 11/2014 | Fuergut et al. |
| 2014/0327150 A1 | 11/2014 | Jung et al. |
| 2014/0346573 A1 | 11/2014 | Adam et al. |
| 2015/0115416 A1 | 4/2015 | Costa et al. |
| 2015/0130045 A1 | 5/2015 | Tseng et al. |
| 2015/0235990 A1 | 8/2015 | Cheng et al. |
| 2015/0235993 A1 | 8/2015 | Cheng et al. |
| 2015/0243881 A1 | 8/2015 | Sankman et al. |
| 2015/0255368 A1 | 9/2015 | Costa |
| 2015/0262844 A1 | 9/2015 | Meyer et al. |
| 2015/0279789 A1 | 10/2015 | Mahajan et al. |
| 2015/0311132 A1 | 10/2015 | Kuo et al. |
| 2015/0364344 A1 | 12/2015 | Yu et al. |
| 2015/0380523 A1 | 12/2015 | Hekmatshoartabari et al. |
| 2016/0002510 A1 | 1/2016 | Champagne et al. |
| 2016/0079137 A1 | 3/2016 | Leipold et al. |
| 2016/0093580 A1 | 3/2016 | Scanlan et al. |
| 2016/0100489 A1 | 4/2016 | Costa et al. |
| 2016/0126111 A1 | 5/2016 | Leipold et al. |
| 2016/0126196 A1 | 5/2016 | Leipold et al. |
| 2016/0155706 A1 | 6/2016 | Yoneyama et al. |
| 2016/0284568 A1 | 9/2016 | Morris et al. |
| 2016/0284570 A1 | 9/2016 | Morris et al. |
| 2016/0343592 A1 | 11/2016 | Costa et al. |
| 2016/0343604 A1 | 11/2016 | Costa et al. |
| 2017/0032957 A1 | 2/2017 | Costa et al. |
| 2017/0077028 A1 | 3/2017 | Maxim et al. |
| 2017/0098587 A1 | 4/2017 | Leipold et al. |
| 2017/0190572 A1 | 7/2017 | Pan et al. |
| 2017/0271200 A1 | 9/2017 | Costa |
| 2017/0323804 A1 | 11/2017 | Costa et al. |
| 2017/0323860 A1 | 11/2017 | Costa et al. |
| 2017/0334710 A1 | 11/2017 | Costa et al. |
| 2017/0358511 A1 | 12/2017 | Costa et al. |
| 2018/0019184 A1 | 1/2018 | Costa et al. |
| 2018/0019185 A1 | 1/2018 | Costa et al. |

FOREIGN PATENT DOCUMENTS

| | | |
|---|---|---|
| JP | 2006005025 A | 1/2006 |
| JP | 2007227439 A | 9/2007 |
| JP | 2008235490 A | 10/2008 |
| JP | 2008279567 A | 11/2008 |
| JP | 2009026880 A | 2/2009 |
| JP | 2009530823 A | 8/2009 |
| WO | 2007074651 A1 | 7/2007 |

OTHER PUBLICATIONS

Rong, B., et al., "Surface-Passivated High-Resistivity Silicon Substrates for RFICs," IEEE Electron Device Letters, vol. 25, No. 4, Apr. 2004, pp. 176-178.

Sherman, Lilli M., "Plastics that Conduct Heat," Plastics Technology Online, Jun. 2001, Retrieved May 17, 2016, http://www.ptonline.com/articles/plastics-that-conduct-heat, Gardner Business Media, Inc., 5 pages.

Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.

Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.

Non-Final Office Action for U.S. Appl. No. 13/852,648, dated Jul. 18, 2013, 20 pages.

Final Office Action for U.S. Appl. No. 13/852,648, dated Nov. 26, 2013, 21 pages.

Applicant-Initiated Interview Summary for U.S. Appl. No. 13/852,648, dated Jan. 27, 2014, 4 pages.

Advisory Action for U.S. Appl. No. 13/852,648, dated Mar. 7, 2014, 4 pages.

Notice of Allowance for U.S. Appl. No. 13/852,648, dated Jun. 16, 2014, 9 pages.

Notice of Allowance for U.S. Appl. No. 13/852,648, dated Sep. 26, 2014, 8 pages.

Notice of Allowance for U.S. Appl. No. 13/852,648, dated Jan. 22, 2015, 8 pages.

Non-Final Office Action for U.S. Appl. No. 13/852,648, dated Jun. 24, 2015, 20 pages.

Final Office Action for U.S. Appl. No. 13/852,648, dated Oct. 22, 2015, 20 pages.

Non-Final Office Action for U.S. Appl. No. 13/852,648, dated Feb. 19, 2016, 12 pages.

Final Office Action for U.S. Appl. No. 13/852,648, dated Jul. 20, 2016, 14 pages.

Non-Final Office Action for U.S. Appl. No. 14/315,765, dated Jan. 2, 2015, 6 pages.

Final Office Action for U.S. Appl. No. 14/315,765, dated May 11, 2015, 17 pages.

Advisory Action for U.S. Appl. No. 14/315,765, dated Jul. 22, 2015, 3 pages.

Non-Final Office Action for U.S. Appl. No. 14/260,909, dated Mar. 20, 2015, 20 pages.

Final Office Action for U.S. Appl. No. 14/260,909, dated Aug. 12, 2015, 18 pages.

Non-Final Office Action for U.S. Appl. No. 14/261,029, dated Dec. 5, 2014, 15 pages.

Notice of Allowance for U.S. Appl. No. 14/261,029, dated Apr. 27, 2015, 10 pages.

Corrected Notice of Allowability for U.S. Appl. No. 14/261,029, dated Nov. 17, 2015, 5 pages.

Non-Final Office Action for U.S. Appl. No. 14/529,870, dated Feb. 12, 2016, 14 pages.

Notice of Allowance for U.S. Appl. No. 14/529,870, dated Jul. 15, 2016, 8 pages.

Non-Final Office Action for U.S. Appl. No. 15/293,947, dated Apr. 7, 2017, 12 pages.

Notice of Allowance for U.S. Appl. No. 15/293,947, dated Aug. 14, 2017, 7 pages.

Non-Final Office Action for U.S. Appl. No. 14/715,830, dated Apr. 13, 2016, 16 pages.

Final Office Action for U.S. Appl. No. 14/715,830, dated Sep. 6, 2016, 13 pages.

Advisory Action for U.S. Appl. No. 14/715,830, dated Oct. 31, 2016, 6 pages.

Notice of Allowance for U.S. Appl. No. 14/715,830, dated Feb. 10, 2017, 8 pages.

Notice of Allowance for U.S. Appl. No. 14/715,830, dated Mar. 2, 2017, 8 pages.

Non-Final Office Action for U.S. Appl. No. 14/851,652, dated Oct. 7, 2016, 10 pages.

Notice of Allowance for U.S. Appl. No. 14/851,652, dated Apr. 11, 2017, 9 pages.

(56) References Cited

OTHER PUBLICATIONS

Corrected Notice of Allowance for U.S. Appl. No. 14/851,652, dated Jul. 24, 2017, 6 pages.
Corrected Notice of Allowance for U.S. Appl. No. 14/851,652, dated Sep. 6, 2017, 5 pages.
Notice of Allowance for U.S. Appl. No. 14/959,129, dated Oct. 11, 2016, 8 pages.
Non-Final Office Action for U.S. Appl. No. 15/173,037, dated Jan. 10, 2017, 8 pages.
Final Office Action for U.S. Appl. No. 15/173,037, dated May 2, 2017, 13 pages.
Advisory Action for U.S. Appl. No. 15/173,037, dated Jul. 20, 2017, 3 pages.
Notice of Allowance for U.S. Appl. No. 15/173,037, dated Aug. 9, 2017, 7 pages.
Non-Final Office Action for U.S. Appl. No. 15/085,185, dated Feb. 15, 2017, 10 pages.
Non-Final Office Action for U.S. Appl. No. 15/085,185, dated Jun. 6, 2017, 5 pages.
Non-Final Office Action for U.S. Appl. No. 15/229,780, dated Jun. 30, 2017, 12 pages.
Non-Final Office Action for U.S. Appl. No. 15/262,457, dated Aug. 7, 2017, 10 pages.
Notice of Allowance for U.S. Appl. No. 15/408,560, dated Sep. 25, 2017, 8 pages.
Notice of Allowance for U.S. Appl. No. 15/287,202, dated Aug. 25, 2017, 11 pages.
Non-Final Office Action for U.S. Appl. No. 15/353,346, dated May 23, 2017, 15 pages.
Notice of Allowance for U.S. Appl. No. 15/353,346, dated Sep. 25, 2017, 9 pages.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
Anderson, D.R., "Thermal Conductivity of Polymers," Sandia Corporation, Mar. 8, 1966, pp. 677-690.
Author Unknown, "96% Alumina, thick-film, as fired," MatWeb, Date Unknown, date accessed Apr. 6, 2016, 2 pages, http://www.matweb.com/search/DataSheet.aspx?MatGUID=3996a734395a4870a9739076918c4297&ckck=1.
Author Unknown, "CoolPoly D5108 Thermally Conductive Polyphenylene Sulfide (PPS)," Cool Polymers, Inc., Aug. 8, 2007, 2 pages.
Author Unknown, "CoolPoly D5506 Thermally Conductive Liquid Crystalline Polymer (LCP)," Cool Polymers, Inc., Dec. 12, 2013, 2 pages.
Author Unknown, "CoolPoly D-Series—Thermally Conductive Dielectric Plastics," Cool Polymers, Retrieved Jun. 24, 2013, http://coolpolymerscom/dseries.asp, 1 page.
Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.
Author Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.
Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.
Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.
Author Unknown, "CoolPoly Selection Tool," Cool Polymers, Inc., 2006, 1 page, http://www.coolpolymers.com/select.asp?Application=Substrates+%26+Electcronic_Packaging.
Author Unknown, "CoolPoly Thermally Conductive Plastics for Dielectric Heat Plates," Cool Polymers, Inc., 2006, 2 pages, http://www.coolpolymers.com/heatplate.asp.
Author Unknown, "CoolPoly Thermally Conductive Plastics for Substrates and Electronic Packaging," Cool Polymers, Inc., 2005, 1 page.
Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.
Author Unknown, "Fully Sintered Ferrite Powders," Powder Processing and Technology, LLC, Date Unknown, 1 page.
Author Unknown, "Heat Transfer," Cool Polymers, Inc., 2006, http://www.coolpolymers.com/heattrans.html, 2 pages.
Author Unknown, "Hysol UF3808," Henkel Corporation, Technical Data Sheet, May 2013, 2 pages.
Author Unknown, "PolyOne Therma-Tech™ LC-5000C TC LCP," MatWeb, Date Unknown, date accessed Apr. 6, 2016, 2 pages, http://www.matweb.com/search/datasheettext.aspx?matguid=89754e8bb26148d083c5ebb05a0cbff1.
Author Unknown, "Sapphire Substrate," from CRC Handbook of Chemistry and Physics, Date Unknown, 1 page.
Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.
Author Unknown, "Thermal Properties of Solids," PowerPoint Presentation, No Date, 28 slides, http://www.phys.huji.ac.il/Phys_Hug/Lectures/77602/PHONONS_2_thermal.pdf.
Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.
Author Unknown, "The Technology: AKHAN's Approach and Solution: The Miraj Diamond™ Platform," 2015, accessed Oct. 9, 2016, http://www.akhansemi.com/technology.html#the-miraj-diamond-platform, 5 pages.
Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.
Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.
Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.
Colinge, J.P., et al., "A Low-Voltage, Low-Power Microwave SOI MOSFET," Proceedings of 1996 IEEE International SOI Conference, Oct. 1996, pp. 128-129.
Costa, J. et al., "Integrated MEMS Switch Technology on SOI-CMOS," Proceedings of Hilton Head Workshop: A Solid-State Sensors, Actuators and Microsystems Workshop, Jun. 1-5, 2008, Hilton Head Island, SC, IEEE, pp. 900-903.
Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.
Costa, J., "RFCMOS SOI Technology for 4G Reconfigurable RF Solutions," Session WEC1-2, Proceedings of the 2013 IEEE International Microwave Symposium, 4 pages.
Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.
Finne, R. M. et al., "A Water-Amine-Complexing Agent System for Etching Silicon," Journal of The Electrochemical Society, vol. 114, No. 9, Sep. 1967, pp. 965-970.
Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.
Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.

(56) References Cited

OTHER PUBLICATIONS

Joshi, V. et al., "MEMS Solutions in RF Applications," 2013 IEEE SOI-3D-Subthreshold Microelectronics Technology Unified Conference (S3S), Oct. 2013, IEEE, 2 pages.
Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.
Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lederer, Dimitri et al., "Substrate loss mechanisms for microstrip and CPW transmission lines on lossy silicon wafers," Solid-State Electronics, vol. 47, No. 11, Nov. 2003, pp. 1927-1936.
Lee, Kwang Hong et al., "Integration of III—V materials and Si-CMOS through double layer transfer process," Japanese Journal of Applied Physics, vol. 54, Jan. 2015, pp. 030209-1 to 030209-5.
Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.
Lu J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, Ye.P., et al., "Electrical and Thermal Conductivity of Polymers Filled with Metal Powders," European Polymer Journal, vol. 38, 2002, pp. 1887-1897.
Mansour, Raafat R., "RF MEMS-CMOS Device Integration," IEEE Microwave Magazine, vol. 14, No. 1, Jan. 2013, pp. 39-56.
Mazuré, C. et al., "Advanced SOI Substrate Manufacturing," 2004 IEEE International Conference on Integrated Circuit Design and Technology, 2004, IEEE, pp. 105-111.
Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, 031101 (2006), 28 pages.
Parthasarathy, S., et al., "RF SOI Switch FET Design and Modeling Tradeoffs for GSM Applications," 2010 23rd International Conference on VLSI Design, (VLSID '10), Jan. 2010, pp. 194-199.
Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Non-Final Office Action for U.S. Appl. No. 15/795,915, dated Feb. 23, 2018, 6 pages.
Non-Final Office Action for U.S. Appl. No. 15/387,855, dated Jan. 16, 2018, 7 pages.
Advisory Action and Applicant-Initiated Interview Summary for U.S. Appl. No. 15/262,457, dated Feb. 28, 2018, 5 pages.
Supplemental Notice of Allowability for U.S. Appl. No. 15/287,273, dated Jan. 17, 2018, 5 pages.
Supplemental Notice of Allowability for U.S. Appl. No. 15/287,273, dated Feb. 23, 2018, 5 pages.
Notice of Allowance for U.S. Appl. No. 15/498,040, dated Feb. 20, 2018, 8 pages.
Non-Final Office Action for U.S. Appl. No. 15/676,415, dated Mar. 27, 2018, 14 pages.
Non-Final Office Action for U.S. Appl. No. 15/676,621, dated Mar. 26, 2018, 16 pages.
International Preliminary Report on Patentability for PCT/US2016/045809, dated Feb. 22, 2018, 8 pages.
Notice of Allowance for U.S. Appl. No. 15/287,273, dated Jun. 30, 2017, 8 pages.
Corrected Notice of Allowability for U.S. Appl. No. 15/287,273, dated Jul. 21, 2017, 5 pages.
Supplemental Notice of Allowability for U.S. Appl. No. 15/287,273, dated Sep. 7, 2017, 5 pages.
Extended European Search Report for European Patent Application No. 15184861.1, dated Jan. 25, 2016, 6 pages.
Office Action of the Intellectual Property Office for Taiwanese Patent Application No. 104130224, dated Jun. 15, 2016, 9 pages.
Non-Final Office Action for U.S. Appl. No. 14/885,202, dated Apr. 14, 2016, 5 pages.
Final Office Action for U.S. Appl. No. 14/885,202, dated Sep. 27, 2016, 7 pages.
Advisory Action for U.S. Appl. No. 14/885,202, dated Nov. 29, 2016, 3 pages.
Notice of Allowance for U.S. Appl. No. 14/885,202, dated Jan. 27, 2017, 7 pages.
Notice of Allowance for U.S. Appl. No. 14/885,202, dated Jul. 24, 2017, 8 pages.
Notice of Allowance for U.S. Appl. No. 14/885,243, dated Aug. 31, 2016, 8 pages.
Non-Final Office Action for U.S. Appl. No. 12/906,689, dated May 27, 2011, 13 pages.
Non-Final Office Action for U.S. Appl. No. 12/906,689, dated Nov. 4, 2011, 20 pages.
Search Report for Japanese Patent Application No. 2011-229152, created on Feb. 22, 2013, 58 pages.
Office Action for Japanese Patent Application No. 2011-229152, drafted May 10, 2013, 7 pages.
Final Rejection for Japanese Patent Application No. 2011-229152, drafted Oct. 25, 2013, 2 pages.
International Search Report and Written Opinion for PCT/US2016/045809, dated Oct. 7, 2016, 11 pages.
Non-Final Office Action for U.S. Appl. No. 15/652,867, dated Oct. 10, 2017, 5 pages.
Bernheim et al., "Chapter 9: Lamination," Tools and Manufacturing Engineers Handbook (book), Apr. 1, 1996, Society of Manufacturing Engineers, p. 9-1.
Fillion R. et al., "Development of a Plastic Encapsulated Multichip Technology for High Volume, Low Cost Commercial Electronics," Electronic Components and Technology Conference, vol. 1, May 1994, IEEE, 5 pages.
Henawy, Mahmoud Al et al., "New Thermoplastic Polymer Substrate for Microstrip Antennas at 60 GHz," German Microwave Conference, Mar. 15-17, 2010, Berlin, Germany, IEEE, pp. 5-8.
International Search Report and Written Opinion for PCT/US2017/046744, dated Nov. 27, 2017, 17 pages.
International Search Report and Written Opinion for PCT/US2017/046758, dated Nov. 16, 2017, 19 pages.
International Search Report and Written Opinion for PCT/US2017/046779, dated Nov. 29, 2017, 17 pages.
Non-Final Office Action for U.S. Appl. No. 15/616,109, dated Oct. 23, 2017, 16 pages.
Corrected Notice of Allowability for U.S. Appl. No. 14/851,652, dated Oct. 20, 2017, 5 pages.
Final Office Action for U.S. Appl. No. 15/262,457, dated Dec. 19, 2017, 12 pages.
Supplemental Notice of Allowability and Applicant-Initiated Interview Summary for U.S. Appl. No. 15/287,273, dated Oct. 18, 2017, 6 pages.
Supplemental Notice of Allowability for U.S. Appl. No. 15/287,273, dated Nov. 2, 2017, 5 pages.
Non-Final Office Action for U.S. Appl. No. 15/491,064, dated Jan. 2, 2018, 9 pages.
Notice of Allowance for U.S. Appl. No. 14/872,910, dated Nov. 17, 2017, 11 pages.
Notice of Allowance for U.S. Appl. No. 15/648,082, dated Nov. 29, 2017, 8 pages.
Non-Final Office Action for U.S. Appl. No. 15/652,826, dated Nov. 3, 2017, 5 pages.
Notice of Allowance for U.S. Appl. No. 15/229,780, dated Oct. 3, 2017, 7 pages.

(56) References Cited

OTHER PUBLICATIONS

Final Office Action for U.S. Appl. No. 15/616,109, dated Apr. 19, 2018, 18 pages.
Notice of Allowance for U.S. Appl. No. 15/795,915, dated Jun. 15, 2018, 7 pages.
Non-Final Office Action for U.S. Appl. No. 15/262,457, dated Apr. 19, 2018, 10 pages.
Notice of Allowance for U.S. Appl. No. 15/491,064, dated Apr. 30, 2018, 9 pages.
Non-Final Office Action for U.S. Appl. No. 15/601,858, dated Jun. 26, 2018, 12 pages.
Notice of Allowance for U.S. Appl. No. 15/616,109, dated Jul. 2, 2018, 7 pages.
Notice of Allowance for U.S. Appl. No. 15/676,621, dated Jun. 5, 2018, 8 pages.
Non-Final Office Action for U.S. Appl. No. 15/676,693, dated May 3, 2018, 14 pages.
Final Office Action for U.S. Appl. No. 15/387,855, dated May 24, 2018, 9 pages.
Notice of Allowance for U.S. Appl. No. 15/695,629, dated Jul. 11, 2018, 12 pages.

* cited by examiner

RADIO FREQUENCY (RF) SWITCH

RELATED APPLICATIONS

This application claims the benefit of provisional patent application Ser. No. 62/410,965, filed Oct. 21, 2016, the disclosure of which is hereby incorporated herein by reference in its entirety.

FIELD OF THE DISCLOSURE

Embodiments of the present disclosure relate to semiconductor and silicon-on-insulator technologies and semiconductor-based radio frequency switches, both of which can be used in radio frequency communications circuits.

BACKGROUND

As technology progresses, wireless communications devices, such as smart phones, wireless capable computers, or the like, are becoming increasingly integrated, feature rich, and complex. Such wireless communications devices rely on semiconductor technologies, such as silicon-based technologies, which are evolving toward smaller circuit geometries, lower power consumption, higher operating speeds, and increased complexity. Complementary metal oxide semiconductor technology is an example of a silicon-based technology. Further, wireless communications devices may need to support multiple communications bands, multiple communications modes, multiple communications protocols, and the like. As such, wireless communications devices may need multiple radio frequency (RF) switches to select between different RF circuits depending on which communications bands, modes, and protocols are in use. Such complex RF systems may place strict linearity, insertion loss, and isolation demands on the RF switches.

In general, RF switches having semiconductor-based switching elements have a trade-off between insertion loss and isolation. RF switches that must handle high power levels require low insertion losses. To achieve low insertion loss and high power handling capability, the size of circuit elements within an RF switch can be relatively large. However, such large circuit elements are associated with relatively large capacitances, which decreases isolation. Further, multiple large capacitances have non-linearities, which degrade linearity of the RF switch. In particular, the performance of an RF switch is in part related to a figure of merit that is equal to the RF switch's ON state resistance $R_{ON}$ multiplied by the RF switch's OFF state capacitance $C_{OFF}$. Thus, there is a need for an RF switch that improves the figure of merit and the trade-off between insertion loss and isolation and has improved linearity performance.

SUMMARY

Disclosed is a radio frequency (RF) switch that includes a substrate and a plurality of elongated drain/source (D/S) diffusion regions laterally disposed in parallel with one another and separated by a plurality of elongated channel regions. A plurality of elongated D/S resistor regions extends between an adjacent pair of plurality of elongated D/S diffusion regions, and a plurality of elongated gate structures reside over corresponding ones of the elongated channel regions. A silicide layer resides over a majority of top surfaces of the plurality of the elongated D/S diffusion regions and the plurality of elongated gate structures, wherein less than a majority of each of the plurality of elongated D/S resistor regions is covered by the silicide layer.

In at least one exemplary embodiment, the RF switch further includes a plurality of body regions wherein each of the plurality of the body regions extends between ends of adjacent pairs of the plurality of elongated D/S diffusion regions. A plurality of body resistor regions extends between an adjacent pair of the plurality of body regions.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
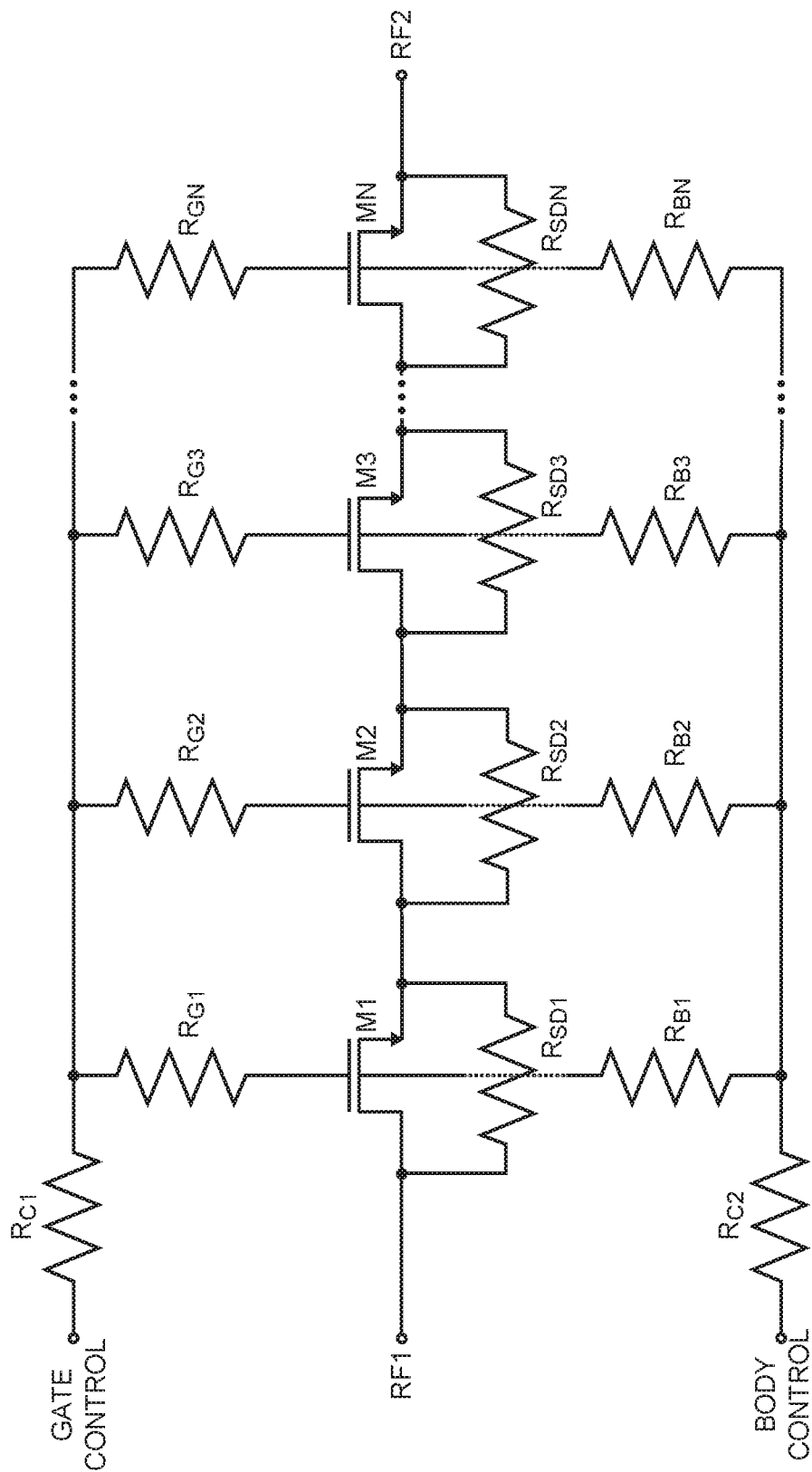
FIG. 1 is a circuit schematic of a related-art radio frequency (RF) switch having source-to-drain resistors along with tree-connected gate bias and body bias resistor networks.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a circuit schematic of a related-art radio frequency (RF) switch having source-to-drain resistors $R_{SD1}$ through $R_{SDN}$ along with tree-connected gate bias and body bias resistor networks. A first common resistor $R_{C1}$ in series with parallel coupled gate resistors $R_{G1}$ through $R_{GN}$ make up a gate bias resistor network that provides proper gate bias to field-effect transistors (FETs) M1 through MN that are stacked in series, wherein N is a finite counting number. The number of N transistors is determined by a maximum RF voltage across the FETs M1 through MN expected for reliable operation. A typical range for N is between 10 and 20 for smartphone transmit power levels. A gate control voltage is applied to a gate control terminal at a free end of the first common resistor $R_{C1}$. A second common resistor $R_{C2}$ in series with parallel body resistors $R_{B1}$ through $R_{BN}$ makes up a body bias resistor network. A body control voltage is applied to a body control terminal at a free end of the second common resistor $R_{C2}$. Biasing the bodies of the FETs M1 through MN provides benefits of lowering resistance of the RF switch when in the ON state and reducing capacitance of the RF switch when in the OFF state.

A first RF signal terminal RF1 is coupled to a drain of the first FET M1 and a second RF signal terminal RF2 is coupled at a source of the Nth FET MN. An RF signal applied to either of the first RF signal terminal RF1 or the second RF signal terminal RF2 is prevented from passing between the first RF signal terminal RF1 and the second RF signal terminal RF2 when the RF switch is in an OFF state. When a ground level or negative potential is applied to the gate control terminal, the FETs M1 through MN that are stacked in series are in the OFF state. In contrast, when a gate voltage that is above a positive threshold voltage (Vth) is applied to the gate control terminal, the FETs M1 through MN are in an ON state. An RF signal applied to either of the first RF signal terminal RF1 or the second RF signal terminal RF2 passes between the first RF signal terminal RF1 and the second RF signal terminal RF2 when each of the FETs M1 through MN is in an ON state. The source-to-drain resistors $R_{SD1}$ through $R_{SDN}$ are coupled across each of the FETs M1 through MN from source to drain to help balance drain-to-source voltages when the FETs M1 through MN are in the OFF state.

Figure 2:
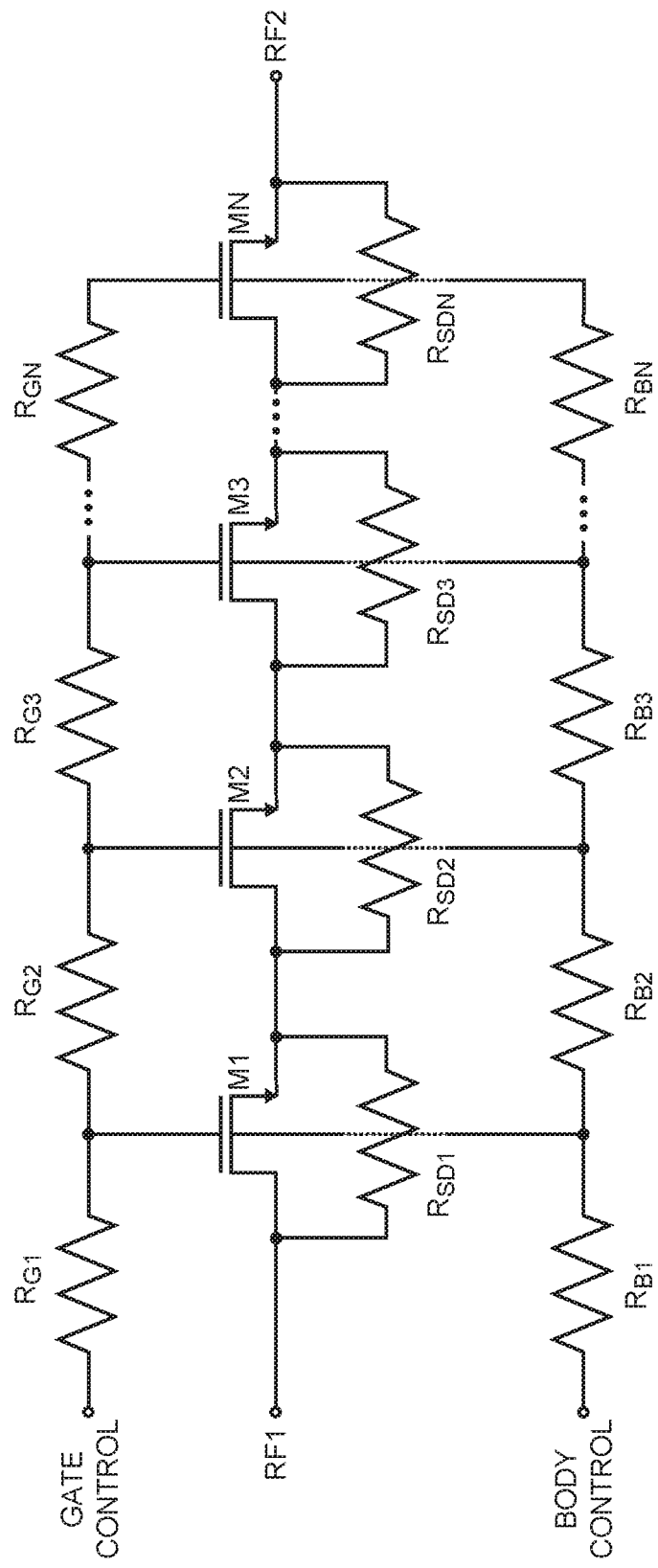
FIG. 2 is a circuit schematic of a related-art RF switch having source-to-drain resistors along with series connected gate bias and body bias networks.

FIG. 2 is a circuit schematic of another related-art RF switch. The RF switch of FIG. 2 also includes the source-to-drain resistors $R_{SD1}$ through $R_{SDN}$. However, in this case, the gate bias resistor and body bias resistor networks have series-connected resistor strings made up of gate resistors $R_{G1}$ through $R_{GN}$ and body resistors $R_{B1}$ through $R_{BN}$, respectively. The operation of the related-art RF switch of FIG. 2 is similar to the operation of the related-art RF switch of FIG. 1 in that a ground level or negative potential applied to a gate control terminal places FETs M1 through MN in an OFF state. In contrast, a positive threshold voltage (Vth) applied to the gate control terminal places the FETs M1 through MN in an ON state. An RF signal applied to either of the first RF signal terminal RF1 or the second RF signal terminal RF2 passes between the first RF signal terminal RF1 and the second RF signal terminal RF2.

Typically, a physical layout for either of the RF switches schematically depicted in FIGS. 1 and 2 requires connections to be made using relatively long and relatively thin metal traces within metal layers referred to in industry as Metal 1 and Metal 2 layers. As such, these metal layers along with contacts and vias are populated among each FET M1 through M2 making up the RF switch. As a result, parasitic resistances and parasitic capacitances due to the metal layers, contacts, and vias accumulate to undesirably high values that are detrimental to the figure of merit (FOM) of the RF switches. For example, the long thin traces of the Metal 1 layer force electrical current traveling horizontally through the long thin traces to encounter a total resistance that is relatively high compared with electrical current flowing vertically through a thicker trace over a shorter distance. Moreover, in a typical layout there are metal contacts directly over diffusion regions making up the drain and source of each of the FETs M1 through MN. Due to close spacing relative to one another, the metal contacts directly over the diffusion regions accumulate a relatively large and undesirable capacitance. The structures of the present disclosure depicted in FIGS. 3, 4, and 5 eliminate the metal contacts directly over the drain and source diffusion regions of interior FETs M2 through MN−1. Moreover, the presently disclosed structures also eliminate traces of the Metal 1 layer that typically carry electrical current to and from the metal contacts directly over the diffusion regions.

Figure 3:
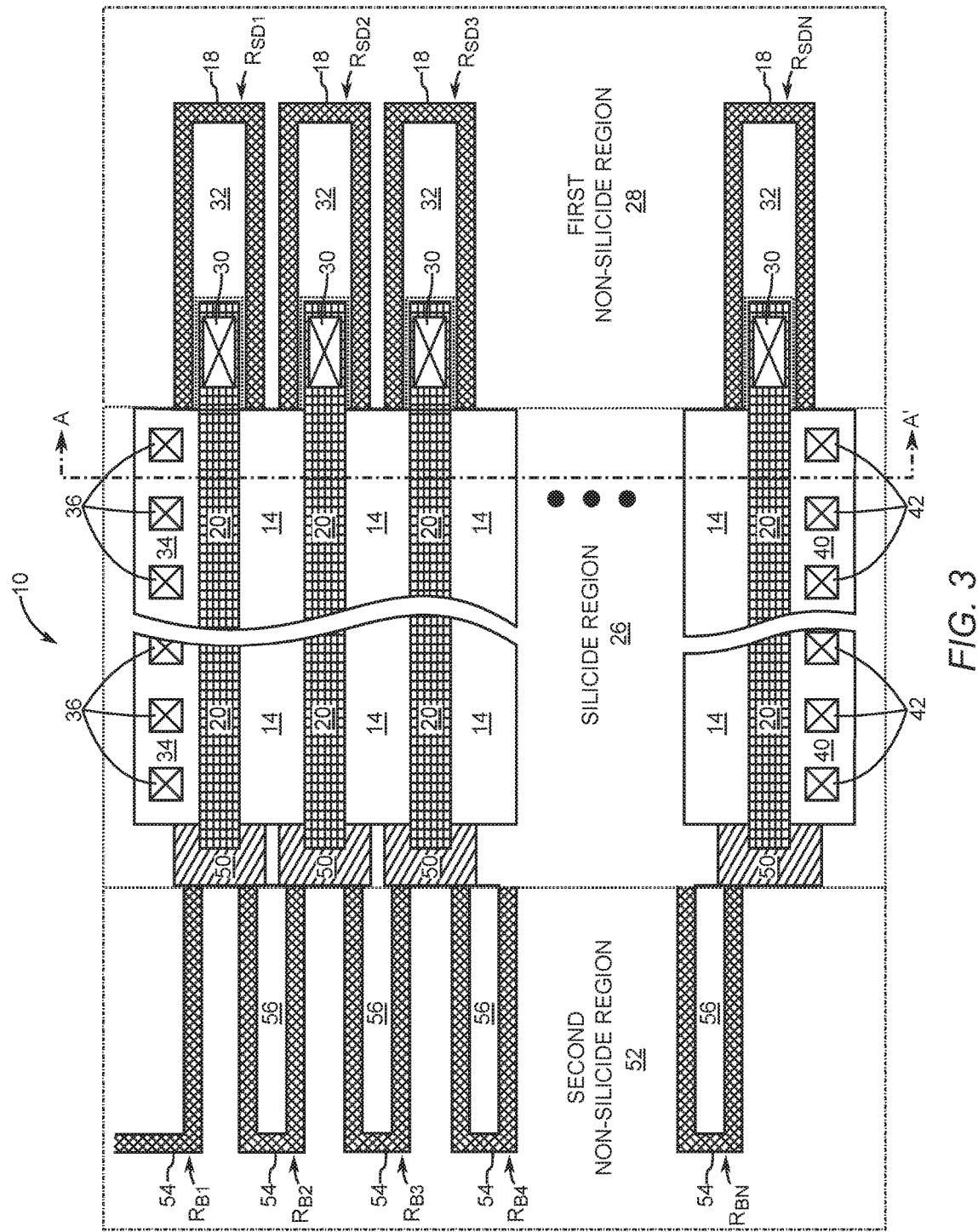
FIG. 3 is a plan view of a first embodiment of an RF switch layout that is in accordance with the present disclosure.

FIG. 3 is a plan view of a first embodiment of a layout for an RF switch 10 that is in accordance with the present disclosure. FIG. 3 is a plan view of structures that realizes the topology of the related-art RF switch of FIG. 2 without employing metal contacts directly over the drain and source diffusion regions of interior FETs M2 through MN−1. As such, the FOM, which is equal to the RF switch's ON state resistance $R_{ON}$ multiplied by the RF switch's OFF state capacitance $C_{OFF}$, is greatly improved.

Figure 4:
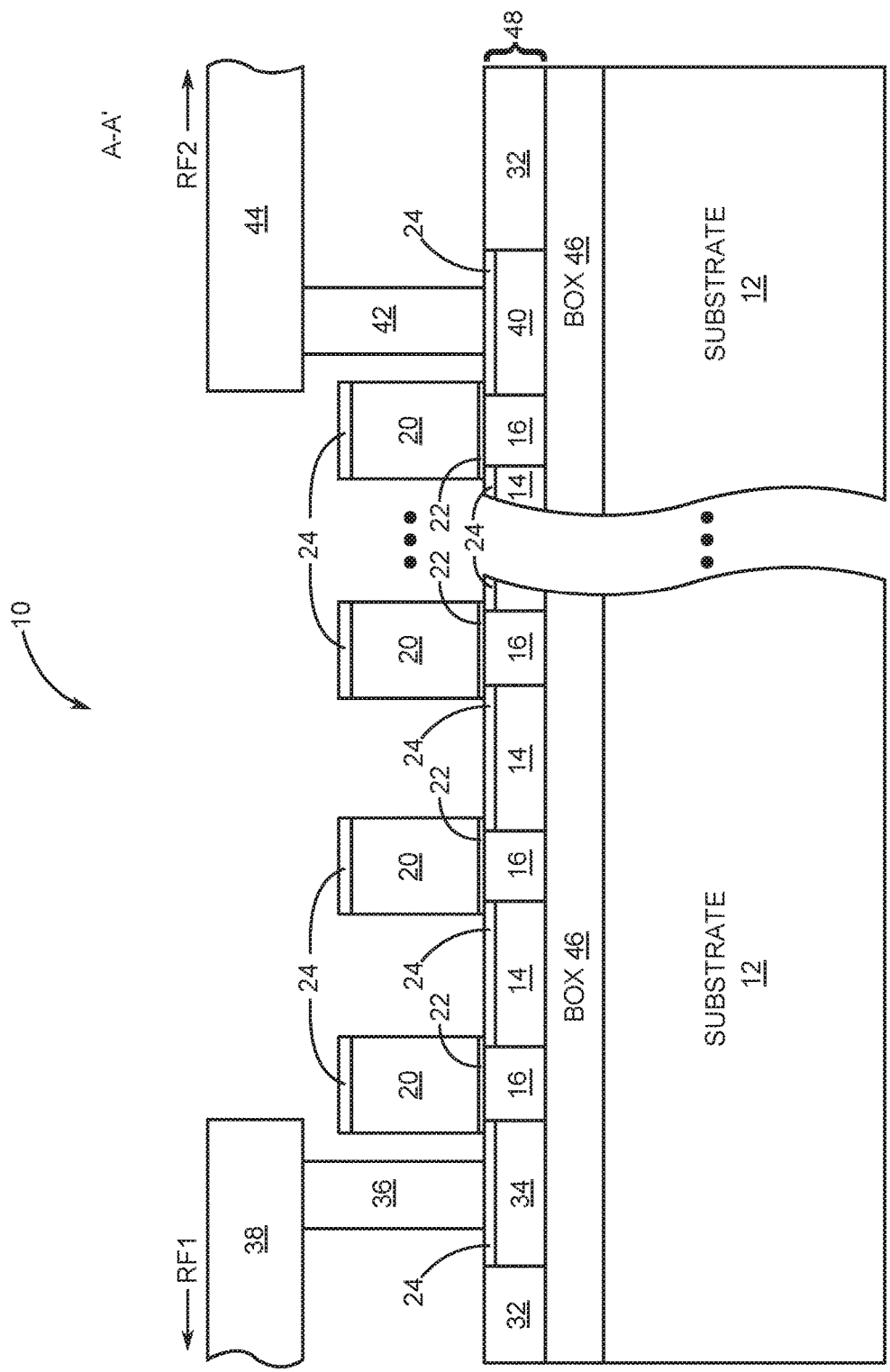
FIG. 4 is a cross-sectional view of the RF switch along a cut-line depicted in FIG. 3.

FIG. 4 is a cross-sectional view of the RF switch 10 along a cut-line A-A' depicted in FIG. 3. As best understood with reference to both FIG. 3 and FIG. 4, the RF switch 10 includes a substrate 12 over which a plurality of elongated drain/source (D/S) diffusion regions 14 are laterally disposed in parallel with one another and are separated by a plurality of elongated channel regions 16. In the exemplary embodiment of FIG. 3 and FIG. 4, the substrate 12 is made of a polymeric material such as a thermoplastic or epoxy. However, it is to be understood that embodiments of the present disclosure remain functional on typical high-resistance semiconductor substrates such as silicon. Nevertheless, there are benefits to replacing the typical high-resistance semiconductor substrates with a substrate made of polymeric material. For example, polymeric material has electrical properties that provide superior isolation during operation and prevent harmonics from being generated within the substrate 12. Moreover, additives such as nanopowders may be included in the polymeric material to increase thermal conductivity of the RF switch 10. Semiconductor substrates may be replaced with polymeric substrates using techniques disclosed in U.S. Patent Publication Nos. 20120094418 A1, 20140252566 A1, 20140306324 A1, 20150255368 A1, 20160079137 A1, 20160100489 A1, 20160126196 A1, 20160343604 A1, 20160284570 A1, 20160343592 A1, 20170077028 A1, 20170032957 A1, 20170098587 A1, and 20170271200 A1; U.S. Pat. Nos. 9,214,337, 9,583,414, 9,530,709, and 9,613,831; and U.S. patent application Ser. No. 15/287,202, filed Oct. 6, 2016, titled MICROELECTRONICS PACKAGE WITH INDUCTIVE ELEMENT AND MAGNETICALLY ENHANCED MOLD COMPOUND COMPONENT; U.S. patent application Ser. No. 15/287,273, filed Oct. 6, 2017, titled MICROELECTRONICS PACKAGE WITH INDUCTIVE ELEMENT AND MAGNETICALLY ENHANCED MOLD COMPOUND COMPONENT; U.S. patent application Ser. No. 15/353,346, filed Nov. 16, 2016, titled THERMALLY ENHANCED SEMICONDUCTOR PACKAGE WITH THERMAL ADDITIVE AND PROCESS FOR MAKING THE SAME; U.S. patent application Ser. No. 15/491,064, filed Apr. 19, 2017, titled THERMALLY ENHANCED SEMICONDUCTOR PACKAGE AND PROCESS FOR MAKING THE SAME; U.S. patent application Ser. No. 15/498,040, filed Apr. 26, 2017, titled SEMICONDUCTOR PACKAGE WITH REDUCED PARASITIC COUPLING EFFECTS AND PROCESS FOR MAKING THE SAME; U.S. patent application Ser. No. 15/601,858, filed May 22, 2017, titled WAFER-LEVEL PACKAGE WITH ENHANCED PERFORMANCE; U.S. patent application Ser. No. 15/648,082, filed Jul. 12, 2017, now U.S. Pat. No. 10,038,055, titled SUBSTRATE STRUCTURE WITH EMBEDDED LAYER FOR POST-PROCESSING SILICON HANDLE ELIMINATION; U.S. patent application Ser. No. 15/652,826, filed Jul. 18, 2017, titled THERMALLY ENHANCED SEMICONDUCTOR PACKAGE HAVING FIELD EFFECT TRANSISTORS WITH BACK-GATE FEATURE; U.S. patent application Ser. No. 15/652,867, filed Jul. 18, 2017, titled THERMALLY ENHANCED SEMICONDUCTOR PACKAGE HAVING FIELD EFFECT TRANSISTORS WITH BACK-GATE FEATURE; U.S. patent application Ser. No. 15/695,579, filed Sep. 5, 2017, titled MICROELECTRONICS PACKAGE WITH SELF-ALIGNED STACKED-DIE ASSEMBLY; and U.S. patent application Ser. No. 15/695,629, filed Sep. 5, 2017, titled MICROELECTRONICS PACKAGE WITH SELF-ALIGNED STACKED-DIE ASSEMBLY, which are hereby incorporated herein by reference in their entireties. Some of the disclosed substrate replacement techniques are applied at a die-level process, whereas others are applied during a wafer-level process.

A plurality of elongated D/S resistor regions 18 makes up the source-to-drain resistors $R_{SD1}$ through $R_{SDN}$ that are depicted in the topologies of FIG. 1 and FIG. 2. Each of the plurality of elongated D/S resistor regions 18 extends between an adjacent pair of the plurality of elongated D/S diffusion regions 14. The RF switch 10 further includes a plurality of elongated gate structures 20. Each of the plurality of elongated gate structures 20 resides over corresponding ones of the plurality of elongated channel regions 16. A gate dielectric layer 22 separates the plurality of elongated gate structures 20 from the plurality of elongated channel regions 16. In an exemplary embodiment, the plurality of elongated gate structures 20 is made of polysilicon, and the gate dielectric layer 22 is made of silicon dioxide. A silicide layer 24 is disposed over a majority of at least top surfaces of the plurality of elongated D/S diffusion regions 14 and the plurality of elongated gate structures 20, whereas less than a majority of each of the plurality of elongated D/S resistor regions 18 are covered by the silicide layer 24. In the exemplary embodiment of FIG. 3 and FIG. 4, the silicide layer 24 covers 100% of the at least top surfaces of the plurality of the elongated D/S diffusion regions 14 and the plurality of elongated gate structures 20. In other exemplary embodiments, the silicide layer 24 covers between 80% and 90% of the at least top surfaces of the plurality of the elongated D/S diffusion regions 14 and the plurality of elongated gate structures 20. Moreover, in at least some embodiments, the silicide layer 24 covers between 0% and less than 50% of the plurality of elongated D/S resistor regions 18.

In the exemplary embodiment of FIG. 3 and FIG. 4, the plurality of elongated D/S diffusion regions 14 extends from a silicide region 26 into a first non-silicide region 28. The first non-silicide region 28 is referred to by some in the semiconductor industry as the silicide block region. As depicted in FIG. 3, each of the plurality of elongated D/S resistor regions 18 is U-shaped, which allows a portion of each of the plurality of elongated gate structures 20 to extend between corresponding ones of the plurality of elongated D/S resistor regions 18. A plurality of gate contacts 30, one for each of the plurality of elongated gate structures 20, is disposed over the portion of each of the plurality of elongated gate structures 20 that extends between corresponding ones of the plurality of elongated D/S resistor regions 18. Moreover, in the exemplary embodiment of FIG. 3, a plurality of shallow trench isolation (STI) regions 32 is formed between the extended portions of the plurality of elongated gate structures 20 and an interior of the U-shaped plurality of elongated D/S resistor regions 18.

The RF switch 10 also includes an elongated source diffusion region 34 having a plurality of source contacts 36 coupled to a first metal trace 38, which in turn is coupled to a first RF signal terminal RF1. Further included is an elongated drain diffusion region 40 having a plurality of drain contacts 42 coupled to a second metal trace 44, which is coupled to a second RF signal terminal RF2. In the exemplary embodiment of FIG. 3, the elongated source diffusion region 34 and the elongated drain diffusion region 40 both reside in the silicide region 26 and are covered by the silicide layer 24. The elongated source diffusion region 34, an adjacent one of the plurality of elongated gate structures 20, and an adjacent one of the plurality of elongated D/S diffusion regions 14 make up a first FET M1. The elongated drain diffusion region 40, an adjacent one of the plurality of elongated gate structures 20, and an adjacent one of the plurality of elongated D/S diffusion regions 14 make up a last FET MN. The remaining plurality of elongated D/S diffusion regions 14 and remaining plurality of elongated gate structures 20 make up interior FETs M2 through MN−1.

In particular reference to FIG. 4, note that there are no metal contacts directly over the plurality of elongated D/S diffusion regions 14 that are coupled to the silicide layer 24. Thus, the RF switch 10 has the benefit of not having typical metallization within the interior of the silicide region 26 between the elongated source diffusion region 34 and the elongated drain diffusion region 40. As a result of this lack of metallization, an ON state resistance $R_{ON}$ and an OFF state capacitance $C_{OFF}$ are significantly reduced, which provides a significantly improved FOM.

The exemplary embodiment of FIG. 3 and FIG. 4 is fabricated with silicon-on-insulator (SOI) technology. As such, a buried oxide (BOX) layer 46 separates the substrate 12 from an active device layer 48 that includes the plurality of elongated D/S diffusion regions 14 and the plurality of elongated D/S resistor regions 18. As such, the plurality of elongated D/S diffusion regions 14 and the plurality of elongated D/S resistor regions 18 reside within a common plane. Moreover, the plurality of elongated D/S resistor regions 18 forms active well resistors. In at least one exemplary embodiment, the plurality of elongated D/S resistor regions 18 is made of polysilicon.

In exemplary embodiments, each of the plurality of elongated D/S resistor regions 18 provides at least between 100 ohms (Ω) and 10,000Ω of resistance between the adjacent pair of the plurality of elongated D/S diffusion regions 14. In other exemplary embodiments, each of the plurality of the elongated D/S resistor regions 18 provides at least between 750Ω and 1,250Ω of resistance between the adjacent pair of the plurality of elongated D/S diffusion regions 14. In particular exemplary embodiments, each of the plurality of elongated D/S resistor regions 18 provides at least 1,000Ω±10% of resistance between the adjacent pair of the plurality of elongated D/S diffusion regions 14.

As best seen in FIG. 3, the RF switch 10 also includes a plurality of body diffusion regions 50 wherein each of the plurality of body diffusion regions 50 extends between ends of adjacent pairs of the plurality of elongated D/S diffusion regions 14 and is included with the silicide region 26. As such, in this exemplary embodiment, top surfaces of the plurality of body diffusion regions 50 are covered by the silicide layer 24. The RF switch 10 further includes a second non-silicide region 52 that is opposite the first non-silicide region 28 with the silicide region 26 in between. A plurality of body resistor regions 54 extends between an adjacent pair of the plurality of body diffusion regions 50 and in this exemplary embodiment extends into the second non-silicide region 52. As such, the plurality of body resistor regions 54 is not covered by the silicide layer 24 in the exemplary embodiment of FIG. 3. In other embodiments, less than a majority of each of plurality of body resistor regions 54 are covered by the silicide layer 24. In some exemplary embodiments, each of the plurality of body resistor regions 54 provides at least between 100Ω and 10,000Ω of resistance between the adjacent pair of the plurality of body regions. In other exemplary embodiments, each of the plurality of body resistor regions 54 provides at least between 750Ω and 1,250Ω of resistance between the adjacent pair of the plurality of body diffusion regions 50. In yet other embodiments, each of the plurality of body resistor regions 54 provides at least 1,000Ω±10% of resistance between the adjacent pair of the plurality of body diffusion regions 50. In exemplary embodiments, the body resistor regions 54 comprise active well resistors. In the exemplary embodiment of FIG. 3, each of the plurality of body resistor regions 54 is U-shaped. A plurality of STI regions 56 extends within rectangular interiors of the plurality of body resistor regions 54 that are U-shaped. The plurality of body resistor regions 54 makes up the resistors $R_{B1}$ through $R_{BN}$ depicted in FIG. 2.

Figure 5:
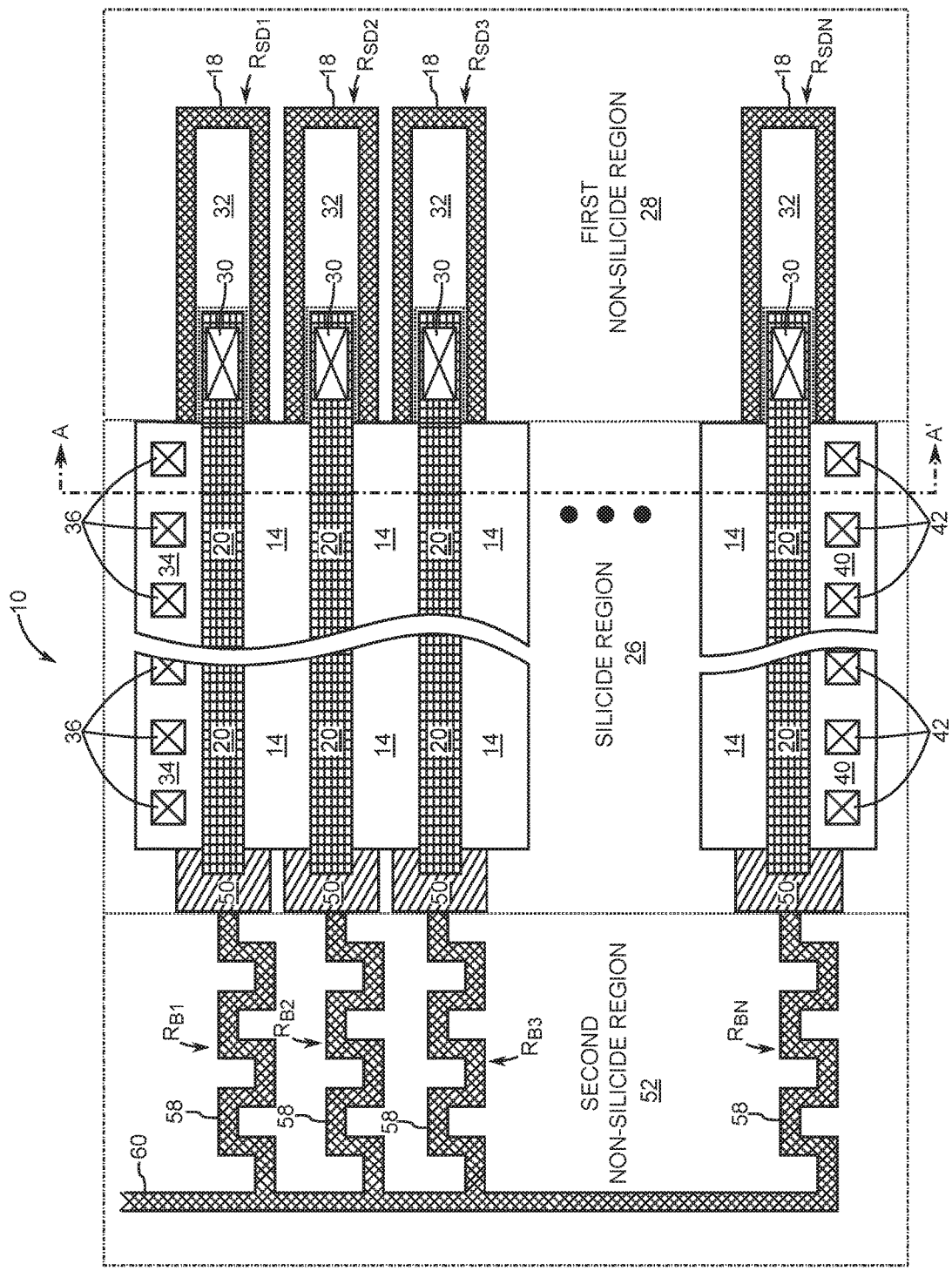
FIG. 5 is a plan view of a second embodiment of an RF switch layout that is in accordance with the present disclosure.

FIG. 5 is a plan view of a second embodiment of an RF switch layout that is in accordance with the present disclosure. In particular, FIG. 5 is a plan view of structures that realizes the topology of the related-art RF switch of FIG. 1 without employing metal contacts directly over the drain and source diffusion regions of interior FETs M2 through MN−1. In this case, a plurality of body resistor regions 58 is coupled between corresponding ones of the plurality of body diffusion regions 50 and a bias node 60. In the exemplary embodiment of FIG. 5, the plurality of body resistor regions 58 extends into the second non-silicide region 52. As such, the plurality of body resistor regions 58 is not covered by the silicide layer 24 in the exemplary embodiment of FIG. 5. In other embodiments, less than a majority of each of the plurality of body resistor regions 58 are covered by the silicide layer 24.

In some exemplary embodiments, each of the plurality of body resistor regions 58 provides at least between 100Ω and 10,000Ω of resistance between the plurality of body diffusion regions 50 and the bias node 60. In other exemplary embodiments, each of the plurality of body resistor regions 58 provides at least between 750Ω and 1,250Ω of resistance between the plurality of body diffusion regions 50 and the bias node 60. In yet other embodiments, each of the plurality of body resistor regions 58 provides at least 1,000Ω±10% of resistance between the plurality of body diffusion regions 50 and the bias node 60. In exemplary embodiments, the plurality of body resistor regions 58 is formed from active well resistors. In the exemplary embodiment of FIG. 5, the plurality of body resistor regions 58 is serpentine-shaped.

Figure 6:
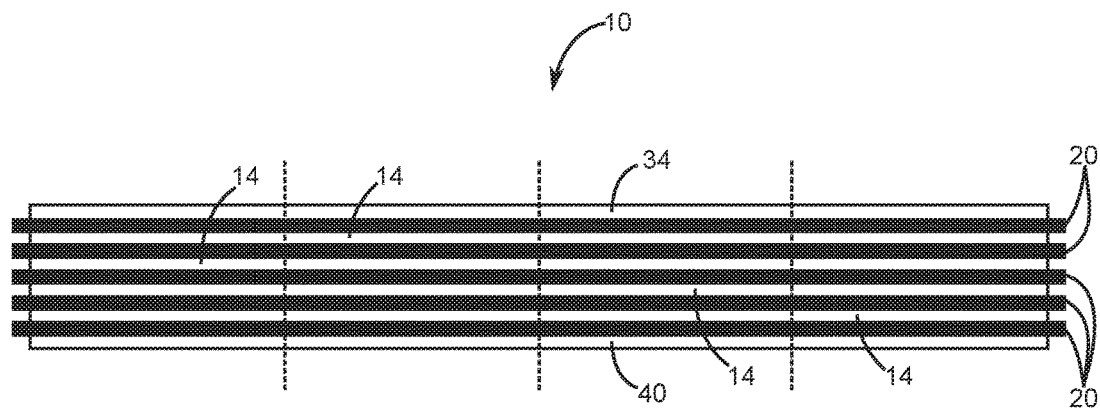
FIG. 6 is a plan view diagram that illustrates an undesirable aspect for the RF switch that is due to merged drain/source diffusions combined with elimination of inner contacts and inner metallization.
Figure 7:
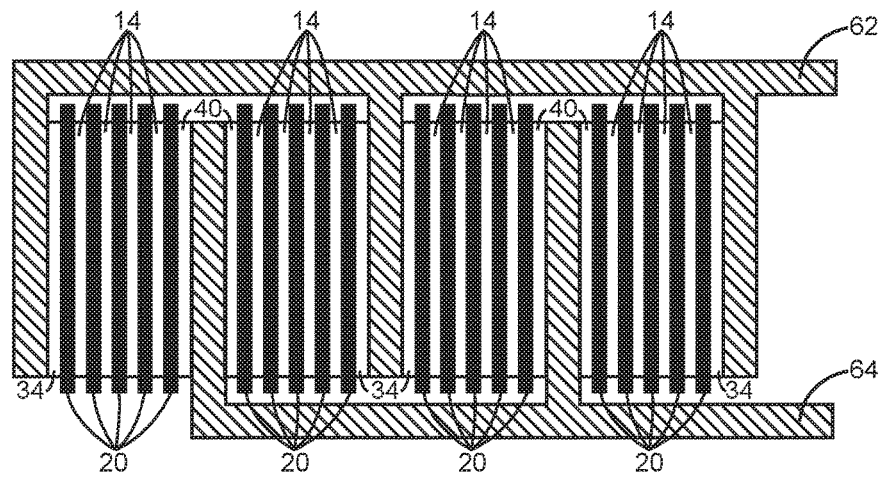
FIG. 7 is a plan view diagram of a layout that restores a desirable aspect ratio in accordance with the present disclosure.

FIG. 6 is a simplified plan view diagram that illustrates an undesirable aspect of the RF switch 10 that is due to merged drain/source diffusions combined with elimination of inner contacts and inner metallization. FIG. 7 is a plan view diagram of a layout that restores a desirable aspect ratio for the RF switch 10 in accordance with the present disclosure. As shown in FIG. 6 by example, the RF switch 10 may be divided into four sections as designated by three dotted lines and rearranged as shown in FIG. 7. The four sections coupled together with river routing using a source metal 62 and a drain metal 64. The plurality of elongated gates structures 20 is coupled using a gate metallization that is not shown. In at least some embodiments, the plurality of elongated D/S diffusion regions 14 is divided into coupled segments such that a width-to-length aspect ratio of the RF switch is between 1:1.5 and 1:3.5.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency (RF) switch comprising:
   a substrate;
   a plurality of elongated drain/source (D/S) diffusion regions laterally disposed in parallel with one another and separated by a plurality of elongated channel regions;
   a plurality of elongated D/S resistor regions wherein each of the plurality of elongated D/S resistor regions extends between an adjacent pair of the plurality of elongated D/S diffusion regions;
   a plurality of elongated gate structures wherein each of the plurality of elongated gate structures resides over corresponding ones of the plurality of elongated channel regions; and
   a silicide layer over a majority of at least top surfaces of the plurality of elongated D/S diffusion regions and the plurality of elongated gate structures, wherein less than a majority of each of the plurality of elongated D/S resistor regions are covered by the silicide layer.

2. The RF switch of claim 1 wherein the plurality of elongated D/S diffusion regions and the plurality of elongated D/S resistor regions reside within a common plane.

3. The RF switch of claim 1 wherein the silicide layer covers between 80% and 90% of the at least top surfaces of the plurality of elongated D/S diffusion regions and the plurality of elongated gate structures.

4. The RF switch of claim 1 wherein the silicide layer covers 100% of the at least top surfaces of the plurality of the elongated D/S diffusion regions and the plurality of elongated gate structures.

5. The RF switch of claim 1 wherein the silicide layer covers between 0% and less than 50% of the plurality of elongated D/S resistor regions.

6. The RF switch of claim 1 wherein each of the plurality of elongated D/S resistor regions provides at least between 100 ohms ($\Omega$) and 10,000$\Omega$ of resistance between the adjacent pair of the plurality of elongated D/S diffusion regions.

7. The RF switch of claim 1 wherein each of the plurality of elongated D/S resistor regions provides at least between 750$\Omega$ and 1,250$\Omega$ of resistance between the adjacent pair of the plurality of elongated D/S diffusion regions.

8. The RF switch of claim 1 wherein each of the plurality of elongated D/S resistor regions provides at least 1,000$\Omega$±10% of resistance between the adjacent pair of the plurality of elongated D/S diffusion regions.

9. The RF switch of claim 1 wherein the plurality of elongated D/S resistor regions comprises active well resistors.

10. The RF switch of claim 9 wherein the plurality of elongated gate structures includes gate contacts that reside between the plurality of elongated D/S resistor regions.

11. The RF switch of claim 1 wherein each of the plurality of elongated D/S resistor regions is U-shaped.

12. The RF switch of claim 1 wherein the substrate is made of a polymeric material.

13. The RF switch of claim 1 wherein there are no metal contacts directly over the plurality of elongated D/S diffusion regions that are coupled to the silicide layer.

14. The RF switch of claim 1 further including a buried oxide (BOX) layer sandwiched between the substrate and the plurality of elongated D/S diffusion regions.

15. The RF switch of claim 1 further comprising:
   a plurality of body regions wherein each of the plurality of body regions extends between ends of adjacent pairs of the plurality of elongated D/S diffusion regions; and
   a plurality of body resistor regions, wherein each of the plurality of body resistor regions extends between an adjacent pair of the plurality of body regions.

16. The RF switch of claim 15 wherein each of the plurality of body resistor regions provides at least between 100$\Omega$ and 10,000$\Omega$ of resistance between the adjacent pair of the plurality of body regions.

17. The RF switch of claim 15 wherein each of the plurality of body resistor regions provides at least between 750$\Omega$ and 1,250$\Omega$ of resistance between the adjacent pair of the plurality of body diffusion regions.

18. The RF switch of claim 15 wherein each of the plurality of body resistor regions provides at least 1,000$\Omega$±10% of resistance between the adjacent pair of the plurality of body diffusion regions.

19. The RF switch of claim 15 wherein the plurality of body resistor regions comprises active well resistors.

20. The RF switch of claim 15 wherein each of the plurality of body resistor regions is U-shaped.

21. The RF switch of claim 15 wherein plurality of elongated D/S diffusion regions is divided into coupled segments such that a width-to-length aspect ratio of the RF switch is between 1:1.5 and 1:3.5.

22. The RF switch of claim 1 further comprising:
   a plurality of body regions wherein each of the plurality of body regions extends between ends of adjacent pairs of the plurality of elongated D/S diffusion regions; and
   a plurality of body resistor regions, wherein each of the plurality of body resistor regions extends between a bias node and corresponding ones of the plurality of body regions.

23. The RF switch of claim 22 wherein each of the plurality of body resistors is serpentine-shaped.

* * * * *